(12) United States Patent
Hayashi et al.

(10) Patent No.: US 8,604,483 B2
(45) Date of Patent: Dec. 10, 2013

(54) THIN FILM SEMICONDUCTOR DEVICE, DISPLAY DEVICE USING SUCH THIN FILM SEMICONDUCTOR DEVICE AND MANUFACTURING METHOD THEREOF

(75) Inventors: Hisao Hayashi, Kanagawa (JP); Masahiro Fujino, Kanagawa (JP); Yasushi Shimogaichi, Kanagawa (JP); Makoto Takatoku, Kanagawa (JP)

(73) Assignee: Sony Corporation, Tokyo (JP)

( * ) Notice: Subject to any disclaimer, the term of this patent is extended or adjusted under 35 U.S.C. 154(b) by 559 days.

(21) Appl. No.: 12/801,791

(22) Filed: Jun. 25, 2010

(65) Prior Publication Data

US 2010/0264422 A1    Oct. 21, 2010

Related U.S. Application Data

(63) Continuation of application No. 09/772,986, filed on Jan. 31, 2001, now abandoned.

(30) Foreign Application Priority Data

Feb. 1, 2000    (JP) ................................. 2000-023475

(51) Int. Cl.
*H01L 29/04* (2006.01)
*H01L 31/036* (2006.01)

(52) U.S. Cl.
USPC .................. 257/64; 257/66; 257/E29.292

(58) Field of Classification Search
USPC ...................... 257/64, 66, E29.292
See application file for complete search history.

(56) References Cited

U.S. PATENT DOCUMENTS

| | | | |
|---|---|---|---|
| 5,010,027 A | 4/1991 | Possin et al. | |
| 5,912,506 A | 6/1999 | Colgan et al. | |
| 6,020,224 A * | 2/2000 | Shimogaichi et al. | 438/158 |
| 6,235,561 B1 | 5/2001 | Seiki et al. | |
| 6,376,290 B1 | 4/2002 | Gosain et al. | |

FOREIGN PATENT DOCUMENTS

| | | |
|---|---|---|
| JP | 63-114263 A | 5/1988 |
| JP | 01-231024 A | 9/1989 |
| JP | 02-002175 A | 1/1990 |

(Continued)

OTHER PUBLICATIONS

Japanese Office Action issued Nov. 24, 2009, for corresponding Japanese Application No. 2000-023475.

(Continued)

*Primary Examiner* — Thien F Tran
(74) *Attorney, Agent, or Firm* — Rader, Fishman & Grauer PLLC

(57) ABSTRACT

A thin film semiconductor device formed as integrated circuits on an insulating substrate with bottom gate type thin film transistors stacked with gate electrodes, a gate insulating film and a semiconductor thin film in the order from below upward. The gate electrodes comprise metallic materials with thickness less than 100 nm. The gate insulating film has a thickness thicker than the gate electrodes. The semiconductor thin film comprises polycrystalline silicon crystallized by a laser beam. By reducing thickness of metallic gate electrodes, thermal capacity becomes small and difference in thermal condition on the metallic gate electrodes and on the insulating substrate made of glass or the like becomes small. This invention relates to the task of uniforming and optimizing recrystallization by a laser anneal treatment provided for the semiconductor thin film which works as an active layer of the bottom gate type thin film transistors.

19 Claims, 7 Drawing Sheets

(56) References Cited

FOREIGN PATENT DOCUMENTS

| | | |
|---|---|---|
| JP | 10-163112 | 6/1998 |
| JP | 10-209467 | 8/1998 |
| JP | 10-229200 | 8/1998 |
| JP | 10-242052 | 9/1998 |
| JP | 11-008392 | 1/1999 |
| JP | 11-111999 | 4/1999 |

OTHER PUBLICATIONS

Japan Office Action issued Jul. 20, 2010 for corresponding Japanese Application No. 2000-023475.

\* cited by examiner

THIN FILM SEMICONDUCTOR DEVICE, DISPLAY DEVICE USING SUCH THIN FILM SEMICONDUCTOR DEVICE AND MANUFACTURING METHOD THEREOF

CROSS REFERENCES TO RELATED APPLICATIONS

The present application is a continuation of application Ser. No. 09/772,986, filed on Jan. 31, 2001, the entirety of which being incorporated herein by reference. The present application claims priority based on Japanese Patent Application No. 2000-023475, filed on Feb. 1, 2000, the entirety of which being incorporated herein by reference.

BACKGROUND OF THE INVENTION

1. Technical Field of the Invention

The present invention relates to a thin film semiconductor device and a display device using thereof as a driving substrate, and manufacturing method of such display device. More specifically, the present invention relates to a structure and a manufacturing technology of the thin film semiconductor device having bottom gate type thin film transistors with polycrystalline silicon or the like as their active layers formed as integrated circuits on an insulating substrate.

2. Description of the Related Art

For a display purpose, a thin film semiconductor device is suitably used for a driving substrate of an active matrix type liquid crystal display or the like, and its development is now vigorously pursued. Polycrystalline silicon or amorphous silicon is used for active layers of the thin film transistors. Particularly, the thin film transistors of the polycrystalline silicon can realize the active matrix type color liquid crystal display device in compact and with high definition, and attract much attention.

According to the conventional semiconductor technology, the polycrystalline silicon is utilized only as materials of electrodes and resistors because the thin film transistors are formed as pixel switching devices on the insulating substrate comprising a transparent glass or the like, but this technology has made it possible for the polycrystalline silicon to be used as the active layer. This is the only one technology that can realize the thin film transistors for the high-performance switching devices capable of high-density designing to achieve an image quality required in the market. Concurrently, this technology has also made it possible to form the peripheral circuitry, which has hitherto used external installed ICs, on the same substrate of the pixel array section with the same process. Further the active matrix liquid crystal display having high-definition and integral-typed peripheral circuitry, which was unable to be achieved by using the amorphous silicon thin film transistors, may be realized.

The polycrystalline silicon has larger carrier mobility compared with the amorphous silicon. Therefore, current driving capability of the polycrystalline silicon thin film transistors becomes large, which makes it possible that the peripheral circuitry such as a horizontal scanning circuit and a vertical scanning circuit requiring high-speed driving are concurrently formed on the same substrate as the thin film transistors for the pixel switching. Consequently, the number of signal wires taken out externally from the thin film semiconductor device for display purpose can be reduced in great deal. Additionally, a CMOS (Complementary Metal-Oxide Semiconductor) circuit formed as integrated circuits with N-channel type and P-channel type thin film transistors may be formed on-chip, and a level shift circuit may be built-in, and timing signals may be driven with low voltage.

As the device technology and the process technology for the thin film transistors, the so-called high temperature process technology adopting the process temperature of 1000° C. or more has conventionally been established. The characteristic of this high temperature process is to reform the semiconductor thin film deposited on a high heat-resistant substrate such as quartz by applying a solid phase growth.

The solid phase growth is a method of thermally treating the semiconductor thin film at a temperature of 1000° C. or more, and it enlarges every one of crystal grains included in the polycrystalline silicon which is a minute aggregate of the silicon crystal at the depositing stage.

The polycrystalline silicon acquired by this solid phase growth can obtain high carrier mobility in the order of 100 $cm^2/v \times s$. In order to execute such high temperature process, it is imperative to adopt a substrate superior in heat resistance, and quartz has conventionally been used for the substrate. However, the quartz has the disadvantage from the standpoint of reducing the manufacturing cost.

Instead of the above-described high temperature process, a low temperature process adopting treatment temperature of 600° C. or less has been developed. As part of adopting the low temperature process to the manufacturing process of the thin film semiconductor device, a laser anneal treatment using a laser beam is attracting attention. This process is such that the laser beam is irradiated to an non-single crystal semiconductor thin film of the amorphous silicon or the polycrystalline silicon or the like deposited on the low heat-resistant insulating substrate such as glass or the like to locally melt by application of heat, and thereafter, during its cooling process, the semiconductor thin film is crystallized. The polycrystalline silicon thin film transistors are formed as integrated circuits with this crystallized semiconductor thin film operating as the active layer (channel region). As the carrier mobility of the crystallized semiconductor thin film becomes high, the thin film transistors can achieve high performance to a certain degree.

Incidentally, a top-gate typed structure is conventionally the mainstream for the thin film transistors. In the top-gate structure, the semiconductor thin film is deposited on the insulating substrate, and then the gate electrodes are further formed above via a gate insulating film. For the low temperature process, a low-cost and large-sized glass plate is used as the insulating substrate. This glass plate contains much impurity metal of Na (sodium) or the like, so that Na is localized according to driving voltage for the thin film transistors. There is a problem of reliability caused by variation of the characteristic of the thin film transistors due to this electric field. Against this, a bottom-gate typed structure suitable for the low temperature process has recently been developed.

According to this structure, the gate electrodes comprising metal film or the like are arranged on the insulating substrate made of glass plate or the like, on top of which the semiconductor thin film is formed via the gate insulating film. The gate electrodes have an effect of shielding the electric field within the glass plate. From the standpoint of the structure, the bottom-gate type structure is superior to the top-gate type structure in reliability.

However, the bottom-gate structure causes a big problem when crystallization by the laser anneal treatment is conducted. In the semiconductor thin film to be recrystallized, the part for a channel region is generally located right above the gate electrodes, and the parts for a source region and a drain region are on the glass plate. On this account, when energy is provided by irradiation of the laser beam, there occur differences in conductive condition or dissipating condition of heat on the glass plate and on the metallic gate electrodes. Consequently, due to the fact that the optimum laser energy is different in the channel region, source region and drain region respectively, it is impossible to execute the laser irradiation with the optimum energy to acquire large carrier mobility.

More specifically, in the case where recrystallization by the laser anneal is conducted, the laser beam is concurrently irradiated to the semiconductor thin film both on the metallic gate electrodes and on the glass plate. In this case, during the semiconductor thin film is once melted and then becomes solidified by cooling process, heat is dissipated on the metallic gate electrodes horizontally through the gate wiring, whereby the semiconductor thin film is solidified in comparatively short time. For this reason, on the metallic gate electrodes and on the glass plate, the crystal grains of the recrystallized semiconductor thin film are different in sizes, which causes the carrier mobility to be non-uniform.

To be extreme, when trying to make large the crystal grain sizes of the semiconductor thin film on the metallic gate electrodes, the semiconductor thin film on the glass plate may evaporate due to excessively large irradiation energy. On the contrary, when trying to make the normal crystal condition of the semiconductor thin film on the glass plate, the grain size of the semiconductor thin film on the metallic gate electrodes becomes small. In other words, when trying to irradiate the laser beam at the time of the laser anneal treatment with the optimum energy to the semiconductor thin film both on the metallic gate electrodes and the insulating substrate comprising glass or the like, there occurs a problem that the process margin becomes very narrow.

The process margin as referred here represents the limit permissible in the manufacturing process with respect to the irradiation energy density of the laser beam. Conventionally, this process margin was very narrow, which necessitated to strictly suppress the variation of the irradiation energy density of the laser beam, thereby accompanying a great deal of difficulty.

Additionally, in the bottom gate structure, the semiconductor thin film is formed above the gate electrodes via the gate insulating film. The gate electrodes normally have a thickness of 100 nm or more, so that on the surface of the insulating substrate there arises a level difference attributable to the thickness of the gate electrodes. The semiconductor thin film is so formed as to get over the level difference existing in the gate electrodes though via the gate insulating film. At the part of the level difference in the semiconductor thin film to be got over, the film thickness tends to become thin as compared with the film thickness of the flat part.

When an etching treatment is conducted in the process after the semiconductor thin film has been formed and crystallized by laser anneal, the semiconductor thin film which has become thin at the level difference part may be corroded with chemical agents or the like, and pinholes may be produced. The case may exist that the semiconductor thin film and the gate electrodes establish a short circuit through these pinholes, which has presented the cause of defect for the thin film transistor devices.

SUMMARY OF THE INVENTION

In order to solve conventional technical problems as described above, the following measures have been instituted. Namely, a thin film semiconductor device pertaining to this invention is formed as integrated circuits on an insulating substrate with bottom gate structured thin film transistors, in which gate electrodes, a gate insulating film and a semiconductor thin film are stacked in the order from below upward.

The gate electrodes are comprised of metallic materials and characterized by the thickness of less than 100 nm. Preferably, the film thickness of the gate insulating film is thicker than that of the gate electrodes. The semiconductor thin film is comprised of polycrystalline silicon crystallized by irradiation of a laser beam. In some cases, the gate electrodes have a multi-layered structure comprised of an upper layer having comparatively low heat-conductivity and high electric resistance and a lower layer having comparatively high heat-conductivity and low electric resistance.

This invention includes a display device using the above-described thin film semiconductor device as the driving substrate. Namely, the display device is formed as integrated circuits on the insulating substrate with matrix pixels and the thin film transistors which drive each pixel. The thin film transistors have the bottom gate structure in which the gate electrodes, the gate insulating film and the semiconductor thin film are formed as integrated circuits on the insulating substrate in the order from below upward. Each of the gate electrodes is comprised of the metallic materials and characterized by the thickness of less than 100 nm. Preferably, the film thickness of the gate insulating film is thicker than that of the gate electrodes. The semiconductor thin film is comprised of the polycrystalline silicon crystallized by irradiation of the laser beam. In some cases, the gate electrodes have a multi-layered structure comprising an upper layer having comparatively low heat conductivity and high electric resistance and a lower layer having comparatively high heat conductivity and low electric resistance.

Furthermore, this invention includes a manufacturing method of the display device described above. Namely, this refers to the manufacturing method of the display device in which the matrix pixels and the thin film transistors for driving each pixel are formed as integrated circuits on the insulating substrate, and includes the process of forming the bottom gate structured thin film transistors by stacking the gate electrodes, the gate insulating film and the semiconductor thin film on the insulating substrate in the order from below upward. The gate electrodes are comprised of metallic materials and characterized to be formed with the thickness of less than 100 nm. Preferably, the gate insulating film may be formed with its film thickness to be thicker than that of the gate electrodes. The semiconductor thin film uses the polycrystalline silicon crystallized by irradiation of the laser beam. In some cases, the gate electrodes may be formed by stacking the upper layer having comparatively low heat conductivity and high electric resistance and the lower layer having comparatively high heat conductivity and low electric resistance.

This invention is characterized in that the thickness of the gate electrodes is made less than 100 nm, whereas the thickness of the gate electrodes in the conventional bottom gate structured thin film transistors is 100 nm or more. By making the thickness of the gate electrodes be thin, thermal capacity thereof becomes small, and the difference in thermal condition becomes small on the gate electrodes comprising metal and on the insulating substrate comprising glass or the like. Because of this, a process margin, which is produced when crystallizing the semiconductor thin film by the laser anneal treatment, expands between on the gate electrodes and on the insulating substrate. Additionally, by making thin the thickness of the gate electrodes, the level difference may be relieved. In consequence, the pinholes of the semiconductor thin film which frequently occur at the level difference part may be suppressed.

Other and further objects, features and advantages of this invention will appear more fully from the following description.

DESCRIPTION OF THE PREFERRED EMBODIMENTS

Figure 1:
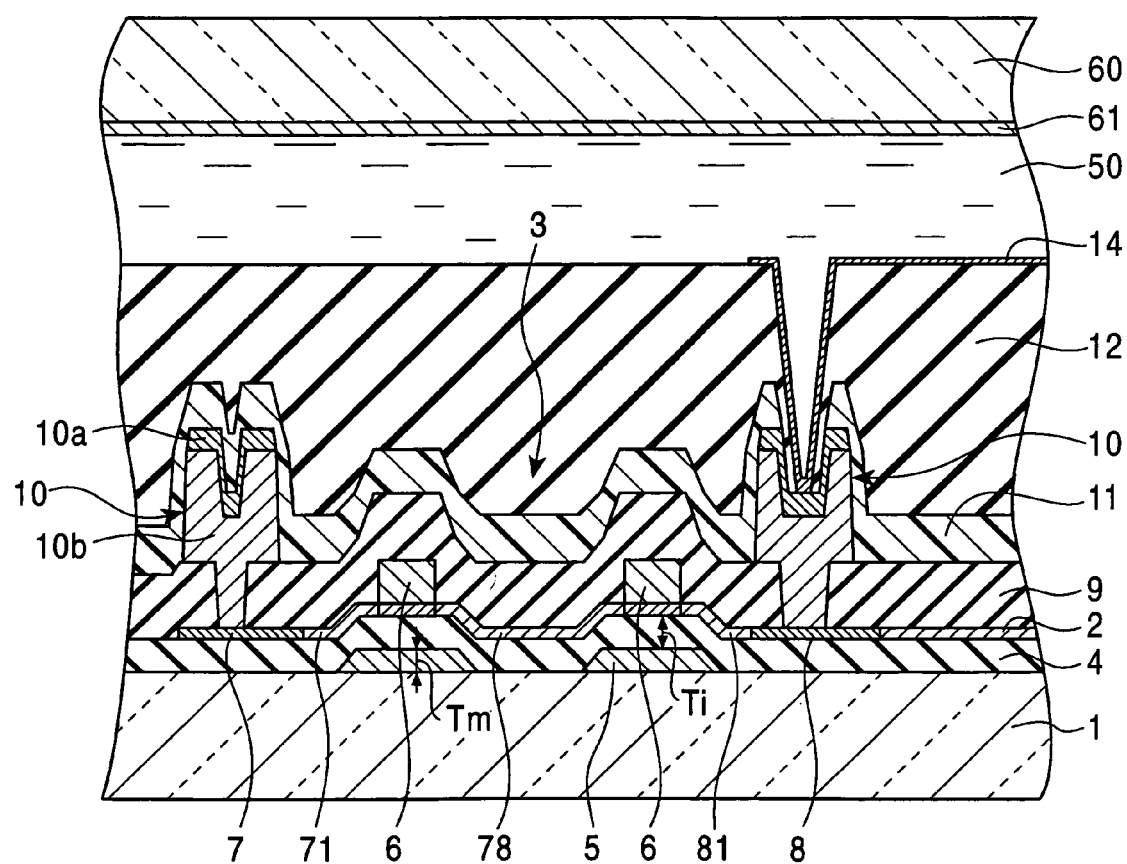
FIG. 1 is a partially sectional view showing a first embodiment of a thin film semiconductor device relating to this invention.

Referring to the following drawings, embodiments of this invention are described in detail. FIG. 1 illustrates one example of a partially sectional view in schematic form showing a first embodiment of a thin film semiconductor device relating to this invention. As illustrated, this thin film semiconductor device is such that a bottom gate structured thin film transistors 3 stacked with a gate electrodes 5, a gate insulating film 4 and a semiconductor thin film 2 in the order from below upward is formed as integrated circuits on an insulating substrate 1 such as glass or the like. This thin film semiconductor device is used as a driving substrate for an active matrix typed display device. For this purpose, pixel electrodes 14 are connected with the thin film transistors 3. In addition, the thin film transistors 3 employ a double gate structure to enhance reliability. However, this invention is not limited to the double gate structure. It is needless to say that this invention is also applicable to single gate structured thin film transistors. For assembling the display device, an insulating substrate 60 of the one side is joined with the insulating substrate 1 of the other side with a predetermined clearance in between. The insulating substrate 60 of the one side is comprised of glass or the like and the surface of the insulating substrate 60 is in advance formed with opposing electrodes 61. At the clearance between both the substrates 60 and 1, a liquid crystal, for instance, is held as an electro-optical substance.

As the characteristic matter of this invention, the gate electrodes are comprised of metallic materials, whose thickness Tm is established with less than 100 nm. As the metallic materials, for instance, metals with high melting point can be adopted, selective from Mo (molybdenum), Ta (tantalum), Cr (chromium) or the like. According to this embodiment, Mo with thickness Tm of, for instance, 90 nm is used. The gate insulating film 4 covering the gate electrodes 5 is comprised of deposited film of, for instance, silicon dioxide ($SiO_2$), whose thickness Ti is established to be greater than the thickness Tm of the gate electrodes 5. By making the thickness Tm of the gate electrodes 5 to be less than 100 nm, thermal capacity can be reduced and the difference in thermal condition on the gate electrodes 5 and the insulating substrate 1 is made small, thereby trying to enlarge a process margin occurred by the laser anneal treatment. In this case, if the thickness Ti of the gate insulating film 4 located between the gate electrodes 5 and the semiconductor thin film 2 is too thin, an effect of reducing the thickness Tm of the gate electrodes 5 is offset. Therefore, the thickness Ti of the gate insulating film 4 is made to become greater than the thickness Tm of the gate electrodes 5. For instance, when the thickness Tm of the gate electrodes 5 is 90 nm, the thickness Ti of the gate insulating film is made to be 110 nm. The semiconductor thin film 2 deposited on the gate insulating film 4 is comprised of polycrystalline silicon crystallized by an irradiation of a laser beam. Its thickness is, for instance, 40 nm.

As described above, the gate electrodes 5 are covered with the gate insulating film 4 made of $SiO_2$ or the like. On this gate insulating film 4 there is deposited the semiconductor thin film 2 comprising polycrystalline silicon or the like. On the semiconductor thin film 2 stoppers 6 comprising, for instance, $SiO_2$ are formed patterned so as to match with each gate electrode 5. The part of the semiconductor thin film 2 located directly underneath the stoppers 6 constitutes a channel region. In addition, in the semiconductor thin film 2 are formed a source region 7 and a drain region 8 to which impurities are injected with high concentration. Furthermore, LDD (lightly doped drain) regions 71, 78 and 81 to which impurities are injected with low concentration are also formed. The thin film transistors 3 are covered with an interlayer film 9 made of $SiO_2$ or the like. Signal wires 10 are formed patterned on the interlayer film 9 and connected electrically to the source region 7 of the thin film transistors 3 via contact holes. The signal wires 10 have two-layer structures with upper layers of metallic film 10a comprising Mo or the like and lower layers of metallic film 10b comprising Al or the like. Likewise, the wirings 10 for connection are formed patterned on the side of the drain region 8. These wirings 10 are covered with a planarized film 12 comprising, for instance, acrylic resin intervened with a passivation film 11 comprising, for instance, $SiO_2$. On the planarized film 12, the pixel electrodes 14 comprising ITO (Indium Tin Oxide) or the like are formed patterned. The pixel electrodes 14 are electrically connected to the drain region 8 in the thin film transistors 3 via the contact holes apertured in the planarized film 12 and the wirings 10 for connection.

Figure 2:
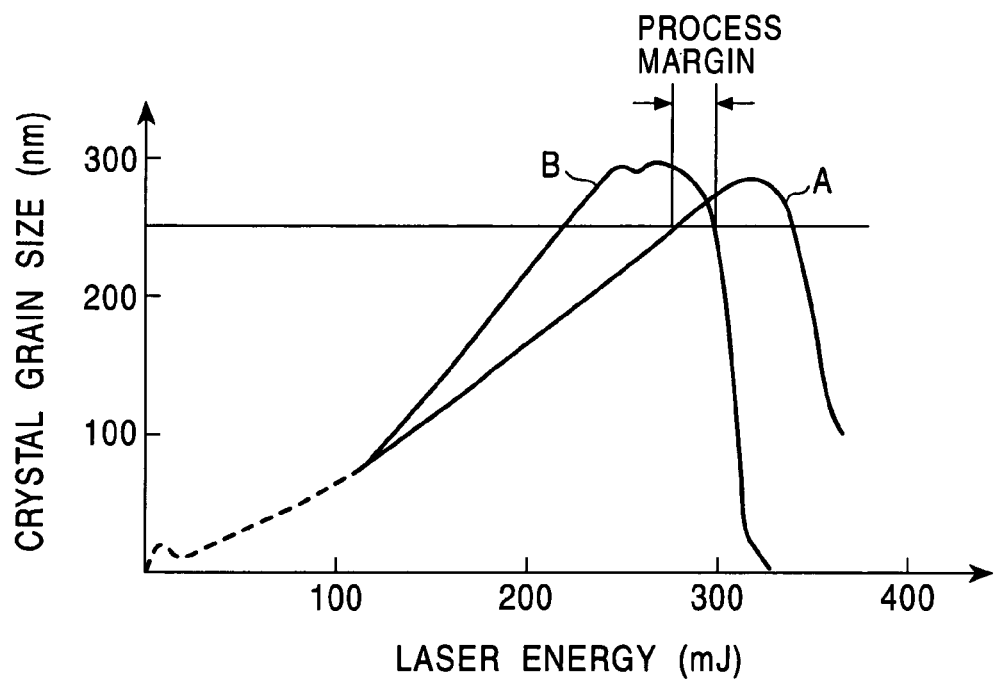
FIG. 2 is a graph showing the relation between a laser energy and a crystal grain size.

FIG. 2 is a graph showing the relation between the laser beam energy used when crystallizing the semiconductor thin film with the laser anneal and the crystal grain sizes of the crystallized semiconductor thin film. According to the graph, a curve A shows the crystal grain sizes of the semiconductor thin film on the gate electrodes, and a curve B shows the crystal grain sizes of the semiconductor thin film on the insulating substrate. In either case, the crystal grain sizes become large, when the laser beam energy increases. However, when the energy becomes too large, the crystal grain sizes, on the contrary, become small. However there are differences in the locations of the peaks of the curve A and curve B. On the metallic gate electrodes, the value of the laser energy producing the maximum crystal grain size exceeds 300 mJ, while, on the insulating substrate comprising glass or the like, the value of the laser energy producing the maximum crystal grain size is 300 mJ or less. With respect to heat conductivity, metal is higher than glass, which makes it easier for the laser beam energy to be dissipated. It is therefore required to make the laser beam energy larger to cover the lost amount of the dissipated energy. According to the device characteristics required for the thin film transistors, the crystal grain sizes are requested to be, for instance, 250 nm or more. In this case, the process margin occupies the range shown in the graph of FIG. 2. Namely, if variation of the laser energy may be confined within this process margin, the crystal grain sizes of the semiconductor thin film may be made to be 250 nm or more both on the metallic gate electrodes and on the insulating substrate comprising glass or the like.

Figure 3:
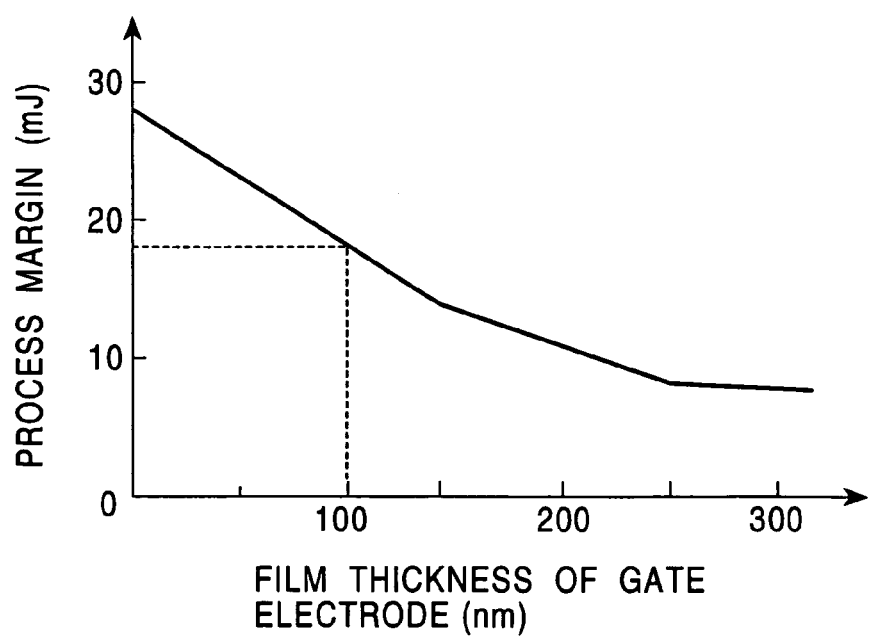
FIG. 3 is a graph showing the relation between a film thickness of gate electrodes and a process margin.

FIG. 3 is a graph showing the relation between the film thickness of the gate electrodes and the above-described process margin. It is understandable that the process margin expands when the film thickness of the gate electrodes reduces. The thinner the thickness of the gate electrodes, the less becomes its thermal capacity, and the difference in thermal condition is reduced on the gate electrodes and on the insulating substrate. With this reduction, the process margin thus expands. The laser beam energy is not constant and always varies in the order of ±3% caused by a variation of a laser oscillating tube. For example, when trying to set the laser energy at 300 mJ, the ±3% variation produces about 18 mJ. Such being the case, the process margin is required to secure 18 mJ. In this case, as is clear from the graph of FIG. 3, the film thickness of the gate electrodes is required to be set to less than 100 nm.

Figure 4:
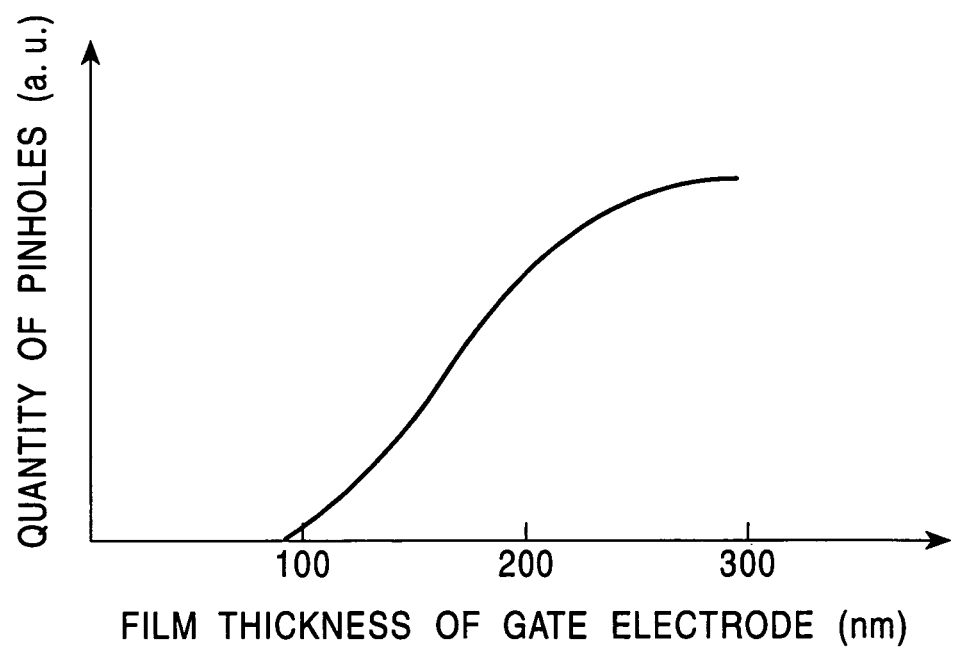
FIG. 4 is a graph showing the relation between a film thickness of the gate electrodes and a quantity of pinholes.

FIG. 4 is a graph showing the relation between the thickness of the gate electrodes and a quantity of pinholes appeared in the semiconductor thin film located at the level difference part of the gate electrodes. As illustrated, the thinner the thickness of the gate electrodes, the more alleviated becomes the level difference, and accordingly appearance of the pinholes is also reduced in quantity. Especially, by making the thickness of the gate electrodes to be less than 100 nm, emergence of the pinholes may almost completely be prevented. In this connection, when the pinholes appear in the semiconductor thin film through the etching process or the like, there is a fear that chemical agents such as hydrofluoric acid corrode the gate insulating film locating underneath through the pinholes, thereby establishing short-circuit defect between the gate electrodes and the gate insulating film.

Figure 5:
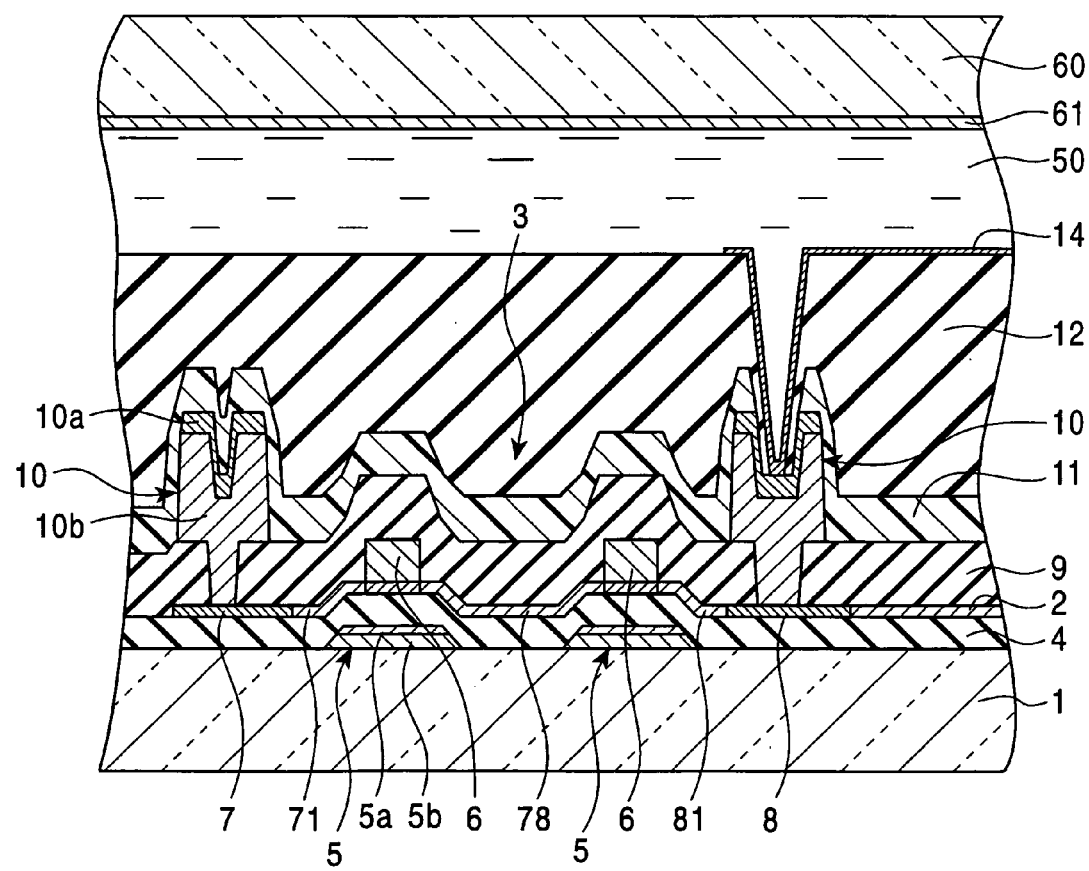
FIG. 5 is a partially sectional view of a second embodiment of the thin film semiconductor device relating to this invention.

FIG. 5 is one example of a partially sectional view in schematic form showing a second embodiment of the thin film semiconductor device relating to this invention. To provide easy understanding, the parts corresponding to the first embodiment shown in FIG. 1 are provided with the corresponding reference numbers thereto to facilitate understanding. Difference from the first embodiment is that, the gate electrodes 5 are not of a single-layer structure but of a multi-layer structure. Namely, the gate electrodes 5 are of the multi-layer structure having an upper layer 5a with comparatively low heat conductivity and high electric resistance stacked with a lower layer 5b with comparatively high heat conductivity and low electric resistance. If the gate electrodes 5 are formed with the thickness to be less than 100 nm according to this invention, the electric resistance inevitably increases. This embodiment employs the multi-layer structure to suppress increase of the electric resistance. Namely, the lower layer 5b is comprised of metal which has low electric resistance compared with the upper layer 5a, and can be made thin for that degree. On the other hand, the upper layer 5a is comprised of metal which has low heat conductivity compared with the lower layer 5b, and suppresses dissipation of heat. For example, the lower layer 5b employs pure metal of aluminum or alloy of aluminum and silicon which is added up to the saturated state, while the upper layer 5a is selective from molybdenum, tantalum, tungsten and chromium. High melting point metal like this, by adopting the multi-layer structure to the gate electrodes 5 in which the lower layer 5b with low electric resistance is stacked with the upper layer 5a with low heat conductivity, it becomes possible to prevent increase of electric resistance while reducing the film thickness.

Figure 6A:
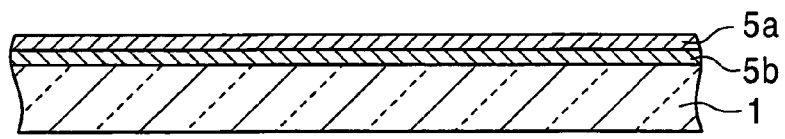
FIGS. 6A to 6E are flow sheets showing a manufacturing method of a second embodiment.

Referring to FIGS. 6A to 6E inclusive, there is described in detail a manufacturing method of the thin film semiconductor device shown in FIG. 5. For easy reference to the drawing, the gate electrode is shown in only one piece. Firstly, as shown in FIG. 6A, the lower layer 5b is overall formed on the insulating substrate 1 comprising glass or the like by applying a sputtering method. This lower layer 5b has preferably low resistance, and employs, for instance, aluminum. On the lower layer 5b, the upper layer 5a is overall deposited by the sputtering method. The upper layer 5a uses the material which has small heat conductivity, and for instance, Mo is appropriate. The total thickness of the multi-layer structure stacked with the upper layer 5a and the lower layer 5b is preferably less than 100 nm. As an example, the film thickness of the lower layer 5b is 50 nm, and then the film thickness of the upper layer 5a may be 40 nm.

Figure 6B:
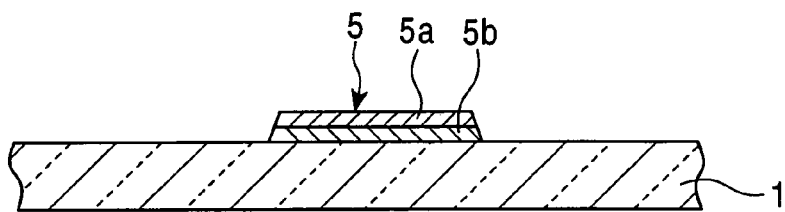

Next, as shown in FIG. 6B, the multi-layer film stacked with the upper layer 5a and the lower layer 5b is patterned by, for instance, an isotropic dry etching process, and processed into the gate electrodes 5. By conducting the isotropic dry etching process, a cross section of the gate electrodes 5 can be shaped into a trapezoid. In other words, the end faces of the gate electrodes 5 are tapered with an angle ranging from 5 to 15 degrees inclusive.

Figure 6C:
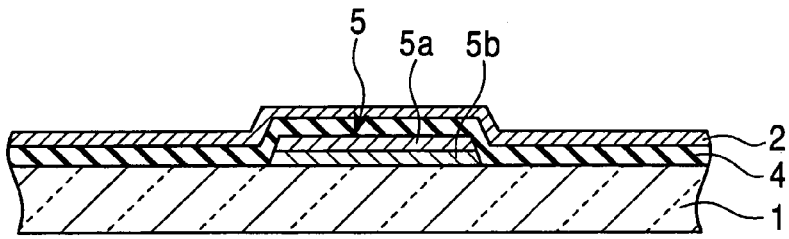

As shown in FIG. 6C, the gate insulating film 4 covering the gate electrodes 5 is formed with deposition of $SiO_2$ in the thickness of 100 to 200 nm inclusive by, for instance, a plasma CVD (chemical vapor deposition) method. Furthermore, on top of that, the semiconductor thin film 2 is formed with deposition of the amorphous silicon in the thickness of, for instance, 20 nm to 60 nm inclusive. The insulating film 4 and the semiconductor thin film 2 can be made grown continuously within the same deposition chamber without breaking vacuum condition. At this stage, the insulating substrate 1 is heated to reach temperature of, for instance, 400° C. The semiconductor thin film 2 of the amorphous silicon deposited with the plasma CVD method includes about 10% hydrogen, which is desorbed by a heat treatment of 400° C. Thereafter, recrystallization of the semiconductor thin film 2 is aimed by irradiation of an XeCL-excimer laser beam with wavelength of, for instance, 308 nm. With the energy of the laser beam, the amorphous silicon is melted to become the polycrystalline silicon when being solidified. Crystallinity (mainly crystal grain size) is determined by the time during solidified.

Figure 6D:
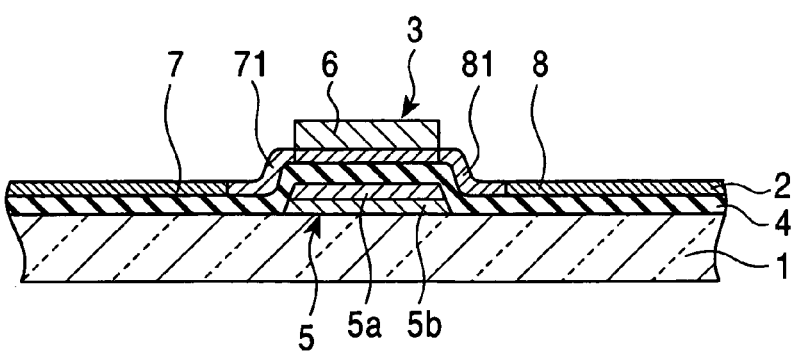
Figure 6E:
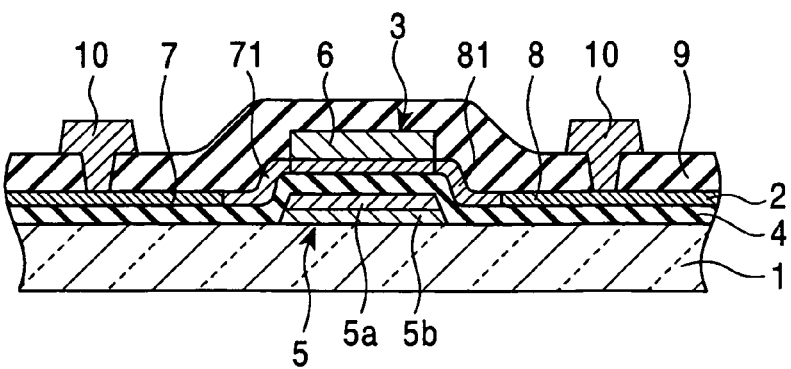

As shown in FIG. 6D, $SiO_2$ is deposited on the semiconductor thin-film 2 by the plasma CVD method. At this stage, $SiO_2$ is patterned by using a back-side exposure technology to process into stoppers 6. Namely, by conducting the back-side exposure technology to the light-proof gate electrodes 5 using as a mask, the stoppers 6 can be obtained to match the gate electrodes 5 by a self-alignment process. At this stage, impurities (for instance, phosphorus) are implanted into the semiconductor thin film 2 with comparatively low concentration by an ion-doping method by utilizing the stoppers 6 as the masks. Furthermore, after the stoppers and their peripheries are covered with photo-resists, impurities (for instance, phosphorus) are implanted into the semiconductor thin film 2 with comparatively low concentration by the ion-doping method. By these processes, the source regions and the drain regions are formed. In the parts of the semiconductor thin film 2 covered with photo-resists, the LDD regions 71 and 81 which have comparatively low impurity concentration are remained. Thereafter, photo-resists which become unnecessary are eliminated. The ion-doping method is the one in which plasma-stated ion is provided with electric field aiding effect at one stretch and doped into the semiconductor film 2, enabling to take short time in the treatment.

Finally, as shown in FIG. 6E, the laser beam is again irradiated to activate doped atoms. This is the same method as recrystallization, but the weak energy is enough as there is no need to make crystals to be large. Thereafter, for insulation between wirings, $SiO_2$ is deposited to form the interlayer film 9. After the contact holes are apertured in this interlayer film 9, metallic aluminum or the like is deposited by the sputtering and patterned into the predetermined shape to process the wirings 10. To follow, in the case of manufacturing the thin film semiconductor device for display purpose, a passivation film, a planarized film and pixel electrodes are formed as the need arises.

Figure 7:
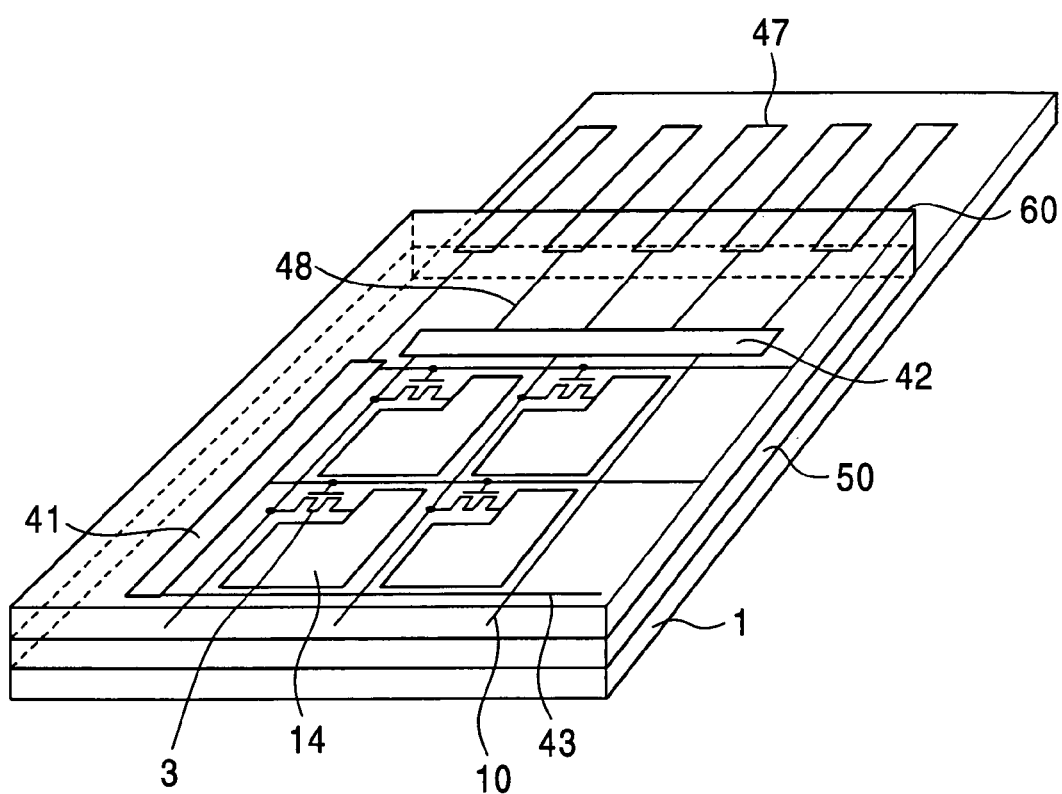
FIG. 7 is a perspective view in schematic form showing one example of an active matrix display device assembled by using the thin film semiconductor device relating to this invention.

FIG. 7 is a perspective drawing in schematic form showing one example of the active-matrix type liquid crystal display device assembled with the thin film semiconductor device relating to this invention for use as the driving substrate. This display device has a structure which holds an electro-optical material 50 comprising liquid crystal or the like between the driving substrate 1 and the opposing substrate 60. On the driving substrate 1 there are formed as integrated circuits a pixel array section and a peripheral circuit section. The peripheral circuit section is divided into a vertical scanning circuit 41 and a horizontal scanning circuit 42. Furthermore, on the upper end part of the driving substrate 1 are also formed terminal electrodes 47 for external connection. Each terminal electrode 47 is connected to the vertical scanning circuit 41 and the horizontal scanning circuit 42 via wirings 48. The pixel array section has a formation of gate wirings 43 and signal wirings 10 which cross each other. The gate wirings 43 are connected to the vertical scanning circuit 41, and the signal wirings 10 are connected to the horizontal scanning circuit 42. At the intersection part of both wirings 43 and 10 are formed the pixel electrodes 14 and the thin film transistors 3 which are manufactured according to this invention and drive the pixel electrodes 14. On the other hand, on the inside surface of the opposing substrate 60, opposing electrodes (not shown) comprising, for instance, ITO are formed.

Figure 8:
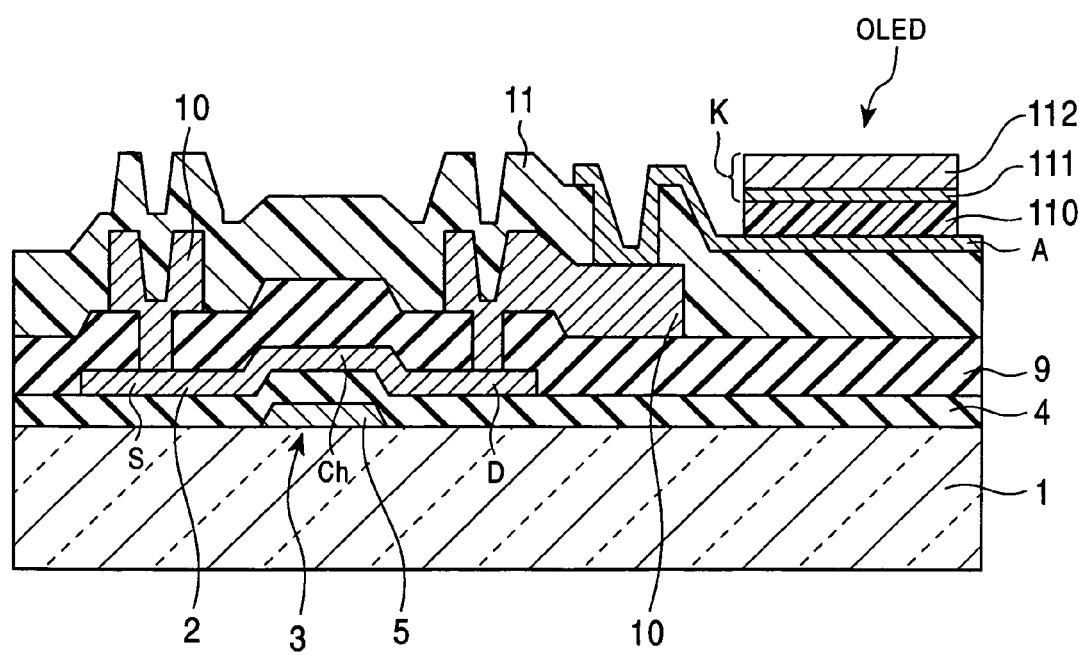
FIG. 8 is a perspective view in schematic form showing another example of the active matrix display device assembled by using the thin film semiconductor device relating to this invention.

FIG. 8 is a partially sectional view in schematic form showing another embodiment of the display device relating to this invention. This embodiment, as its pixels, uses an OLED (organic light emitting diode) which is an organic electro-luminescent device. The OLED is made by stacking with anodes A, organic layers 110 and cathodes K in this order. The anodes A are separated according to every pixel, and comprised of, for instance, chromium basically having optical reflectivity. The cathodes K are commonly connected among the pixels, and have stacked structure of, for instance, metallic layers 111 and transparent conductive layers 112 with basically light transmission.

When a forward voltage (the order of 10V) is applied between the anodes A and the cathodes K of the OLED having such the structure, injection of carriers such as electrons and holes occur and light emission is observed. Behavior of the OLED is considered to be light emission occurred by exitons formed by the holes injected from the anodes A and the electrons injected from the cathodes K.

On the other hand, the thin film transistors 3 for driving the OLED are comprised of the gate electrodes 5 formed on the insulating substrate 1 comprising glass or the like, the gate insulating film 4 stacked thereon, and the semiconductor thin film 2 stacked above the gate electrodes 5 via this gate insulating film 4. This semiconductor thin film 2 is comprised of the silicon thin film crystallized by the laser anneal method adopted by this invention. The thin film transistors 3 include the source regions S working as a passage of electric current supplied to the OLED, the channel regions Ch and the drain regions D. The channel regions Ch are located right above the gate electrodes 5. The thin film transistors 3 having this bottom gate structure are covered by the interlayer film 9, on which the wirings 10 are formed. On top of these is deposited the above-described OLED via another interlayer film 11. The anodes A of this OLED are electrically connected to the thin film transistors 3 via wirings 10. According to this embodiment as well, the film thickness of the gate electrodes 5 is set to be less than 100 nm, thereby expanding the process margin in connection with the laser anneal treatment of the semiconductor thin film 2.

As described above, according to this invention, the process margin at the time of the laser anneal treatment of the semiconductor thin film expands by making the thickness of the gate electrodes to be less than 100 nm, thereby providing the easy checking and maintenance of the laser system to be used for the laser anneal treatment. Furthermore, even if a laser oscillating tube has a fluctuation, its tolerance range expands, which makes it easy to design optical base or the like of the laser system. In addition, manufacturing yield may increase because the pinholes disappear from the part of the semiconductor thin film located on the level difference of the gate electrodes.

While preferred embodiments of the invention have been described, such description is for illustrative purpose only, and it is to be understood that changes and variations may be made without departing from the spirit and scope of the invention.

What is claimed is:

1. A thin film semiconductor device comprising:
   an insulating substrate; and
   a thin film transistor formed on said insulating substrate, wherein
   said thin film transistor is formed in a bottom gate structure having gate electrode, a gate insulating film, and a semiconductor thin film stacked in the order from below upward,
   said gate electrode is made of metallic material having a thickness of less than 100 nm; and
   crystallized polycrystalline silicon which crystal grain sizes are 250 nm or more is formed in an area of said semiconductor thin film both on the gate electrode and on the insulating substrate.

2. The thin film semiconductor device according to claim 1, wherein said gate insulating film has a thickness thicker than the thickness of said gate electrode.

3. The thin film semiconductor device according to claim 1, wherein said semiconductor thin film comprises polycrystalline silicon crystallized by an irradiation of a laser beam.

4. The thin film semiconductor device according to claim 1, wherein said gate electrode has a multi-layered structure stacked with an upper layer having comparatively low heat conductivity and high electric resistance, and a lower layer having comparatively high heat conductivity and low electric resistance.

5. A display device comprising:
   an insulating substrate;
   pixels arranged in a matrix form; and
   thin film transistors for driving said respective pixels, wherein
   said pixels and said thin film transistors are formed as integrated circuits on said insulating substrate, each of said thin film transistors has a bottom gate structure having a gate electrode, a gate insulating film and a semiconductor thin film stacked in the order from below upward, said gate electrode is made of metallic material having a thickness of less than 100 nm;

said gate insulating film has a thickness thicker than the thickness of the gate electrode; and crystallized polycrystalline silicon which crystal grain sizes are 250 nm or more is formed in an area of said semiconductor thin film both on the gate electrode and on the insulating substrate.

6. The display device according to claim 5, wherein said semiconductor thin film comprises polycrystalline silicon crystallized by an irradiation of a laser beam.

7. The display device according to claim 5, wherein said gate electrodes have a multi-layer structure stacked with an upper layer having comparatively low heat conductivity and high electric resistance, and a lower layer having comparatively high heat conductivity and low electric resistance.

8. A thin film semiconductor device comprising:
a gate insulating film between an insulating substrate and a polycrystalline silicon thin film, a channel region of the thin film being between a source region of the thin film and a drain region of the thin film;
a metallic gate electrode between said channel region and a portion of the substrate, said gate insulating film being thicker than said gate electrode,
wherein said gate electrode has a thickness of less than 100 nm, crystal grain sizes of the thin film being 250 nm or more in both said source region and said channel region.

9. The thin film semiconductor device according to claim 8, wherein said substrate is a glass substrate.

10. The thin film semiconductor device according to claim 8, wherein said gate electrode is thicker than said thin film.

11. The thin film semiconductor device according to claim 8, wherein a portion of the insulating film is in physical direct contact with said substrate and said source region, said portion of the insulating film being between said substrate and said source region.

12. The thin film semiconductor device according to claim 8, wherein said gate electrode is in physical direct contact with said channel region and said portion of the substrate.

13. A display device comprising:
pixels arranged in a matrix form, each of the pixels having the thin film semiconductor device according to claim 8.

14. The thin film semiconductor device according to claim 8, wherein a lower metallic layer of the gate electrode is in physical direct contact with an upper metallic layer of the gate electrode and said portion of the substrate, said lower metallic layer being between said upper metallic layer and said portion of the substrate.

15. The thin film semiconductor device according to claim 14, wherein an electric resistance of the lower metallic layer is lower than an electric resistance of the upper metallic layer.

16. The thin film semiconductor device according to claim 14, wherein a heat conductivity of the lower metallic layer is higher than a heat conductivity of the upper metallic layer.

17. The thin film semiconductor device according to claim 14, wherein said upper metallic layer is from the group consisting of molybdenum, tantalum, and chromium.

18. The thin film semiconductor device according to claim 14, wherein said lower metallic layer is aluminum.

19. The thin film semiconductor device according to claim 14, wherein said lower metallic layer is an alloy of aluminum and silicon.

\* \* \* \* \*